(12) United States Patent
Jia

(10) Patent No.: US 11,360,361 B2
(45) Date of Patent: Jun. 14, 2022

(54) ARRAY SUBSTRATE MOTHERBOARD AND DISPLAY PANEL MOTHERBOARD

(71) Applicants: ORDOS YUANSHENG OPTOELECTRONICS CO., LTD., Inner Mongolia (CN); BOE TECHNOLOGY GROUP CO., LTD., Beijing (CN)

(72) Inventor: Dan Jia, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 113 days.

(21) Appl. No.: 16/957,343

(22) PCT Filed: Dec. 25, 2019

(86) PCT No.: PCT/CN2019/128299
§ 371 (c)(1),
(2) Date: Jun. 23, 2020

(87) PCT Pub. No.: WO2020/140810
PCT Pub. Date: Jul. 9, 2020

(65) Prior Publication Data
US 2021/0033934 A1 Feb. 4, 2021

(30) Foreign Application Priority Data

Jan. 4, 2019 (CN) .......................... 201910008814.2

(51) Int. Cl.
*G02F 1/1362* (2006.01)
*H01L 21/66* (2006.01)
(Continued)

(52) U.S. Cl.
CPC .. *G02F 1/136204* (2013.01); *G02F 1/136286* (2013.01); *H01L 22/32* (2013.01);
(Continued)

(58) Field of Classification Search
CPC ......... G02F 1/136204; G02F 1/136286; G02F 1/136254; H01L 22/32; H01L 23/60; H01L 27/1244
See application file for complete search history.

(56) References Cited

U.S. PATENT DOCUMENTS

| 6,172,410 | B1 | 1/2001 | Nagata et al. |
| 2002/0063843 | A1* | 5/2002 | Yu ........................ G02F 1/1309 349/187 |

(Continued)

FOREIGN PATENT DOCUMENTS

| CN | 101320147 A | 12/2008 |
| CN | 102681224 A | 9/2012 |

(Continued)

OTHER PUBLICATIONS

Decision of Rejection for related CN App. No 201910008814 2 dated Dec. 3, 2020. English translation provided 11 pages.
(Continued)

*Primary Examiner* — James A Dudek
(74) *Attorney, Agent, or Firm* — Procopio, Cory, Hargreaves & Savitch LLP

(57) ABSTRACT

An array substrate motherboard includes a plurality of array substrates and a plurality of connection lines. Each of the plurality of array substrates includes an electrical test region, and the electrical test region includes a first conductive terminal. The plurality of connection lines are electrically connected to first conductive terminals of electrical test regions of the plurality of array substrates to electrically connect the plurality of array substrates together.

19 Claims, 8 Drawing Sheets

(51) Int. Cl.
*H01L 23/60* (2006.01)
*H01L 27/12* (2006.01)

(52) U.S. Cl.
CPC .......... *H01L 23/60* (2013.01); *H01L 27/1244* (2013.01); *G02F 1/136254* (2021.01)

(56) References Cited

U.S. PATENT DOCUMENTS

| | | | |
|---|---|---|---|
| 2009/0244420 A1* | 10/2009 | Chung | G02F 1/1309 |
| | | | 349/40 |
| 2014/0106489 A1 | 4/2014 | Lee et al. | |
| 2015/0379907 A1 | 12/2015 | Liu et al. | |
| 2019/0146256 A1 | 5/2019 | Zhang et al. | |

FOREIGN PATENT DOCUMENTS

| | | |
|---|---|---|
| CN | 104090437 A | 10/2014 |
| CN | 106773430 A | 5/2017 |
| CN | 106814490 A | 6/2017 |
| CN | 109445217 A | 3/2019 |
| KR | 20060134263 A | 12/2006 |
| TW | 559684 B | 11/2003 |

OTHER PUBLICATIONS

First Office Action for related CN App. No. 201910008814.2 dated Mar. 30, 2020. English translation provided; 17 pages.
Second Office Action for related CN App. No. 201910008814.2 dated Aug. 25, 2020. English translation provided; 16 pages.

* cited by examiner

ARRAY SUBSTRATE MOTHERBOARD AND DISPLAY PANEL MOTHERBOARD

CROSS-REFERENCE TO RELATED APPLICATIONS

This application is a national phase entry under 35 USC 371 of international Patent Application No. PCT/CN2019/128299 filed on Dec. 25, 2019, which claims priority to Chinese Patent Application No. 201910008814.2, filed with the Chinese Patent Office on Jan. 4, 2019, titled "AN ARRAY SUBSTRATE MOTHERBOARD AND DISPLAY PANEL MOTHERBOARD", which are incorporated herein by reference in their entirety.

TECHNICAL FIELD

The present disclosure relates to the field of display technologies, and in particular, to an array substrate motherboard and a display panel motherboard.

BACKGROUND

At present, a problem of accumulation of static electricity often occurs in a process of manufacturing a display panel motherboard. For example, the process of manufacturing the display panel motherboard needs to involve sampling inspections by a microscope and other operations, and there are a plurality of times of operations such as taking out, puffing in and carry by workers. Since instantaneous static electricity generated by a human body may reach tens of thousands of volts, the problem of accumulation of the static electricity will occur in this process. For another example, in a thinning process (i.e., slimming process) or a cutting process (e.g., cutting in sticks (i.e., a Stick Cut), cutting in groups (i.e., a Group Cut), or cutting in cells (i.e., a Cell Cut)), there are also operations such as manual carry and screens classifying by the workers, and thus the problem of accumulation of the static electricity will also occur in this process.

If an amount of the accumulated static electricity is excessive, an electro-static discharge (ESD) will cause great damage to a display panel. For example, a protective circuit will be burned or a short circuit of the protective circuit will occur, which will cause an abnormal display to occur when a lighting operation during an electrical test (ET) is performed, thereby affecting a quality of the display panel.

SUMMARY

In one aspect, embodiments of the present disclosure provide an array substrate motherboard. The array substrate motherboard includes a plurality of array substrates and a plurality of connection lines. Each of the plurality of array substrates includes an electrical test region, and the electrical test region includes a first conductive terminal. The plurality of connection lines are electrically connected to first conductive terminals of electrical test regions of the plurality of array substrates to electrically connect the plurality of array substrates together.

In some embodiments, the plurality of connection lines are disposed between the plurality of array substrates, and the plurality of connection lines extend in a row direction or a column direction in which the plurality of array substrates are arranged.

In some embodiments, array substrates in each row in the plurality of array substrates are electrically connected together through one of the plurality of connection lines; or, array substrates in each column in the plurality of array substrates are electrically connected together through one of the plurality of connection lines; or, array substrates in each row in the plurality of array substrates are electrically connected together through one of the plurality of connection lines, and array substrates in each column in the plurality of array substrates are electrically connected together through another one of the plurality of connection lines.

In some embodiments, the plurality of connection lines include a plurality of first connection lines and a plurality of second connection lines. The array substrate motherboard has a plurality of display units, and each of the plurality of display units includes at least two of the plurality of array substrates; and each display unit further includes a group electrical test region, and the group electrical test region includes a plurality of second conductive terminals, and the plurality of second conductive terminals include a first group and a second group. In each display unit, the first conductive terminal of the electrical test region of each array substrate is electrically connected to a second conductive terminal of the first group of the group electrical test region of the display unit through at least one of the plurality of first connection lines. Second conductive terminals of second groups of group electrical test regions of the plurality of display units are electrically connected together through the plurality of second connection lines.

In some embodiments, the at least two array substrates in each display unit includes m rows and n columns of array substrates. m and n are positive integers, m is less than a number of rows in which the plurality of array substrates in the array substrate motherboard are arranged, and n is less than a number of columns in which the plurality of array substrates in the array substrate motherboard are arranged.

In some embodiments, m and n are both greater than 1. In each display unit, first conductive terminals of electrical test regions of array substrates in a same row are electrically connected to one of the plurality of first connection lines; and in each display unit, first conductive terminals of electrical test regions of array substrates in a same column are electrically connected to another one of the plurality of first connection lines.

In some embodiments, second conductive terminals of second groups of group electrical test regions of display units in a same row are electrically connected to one of the plurality of second connection lines; or, second conductive terminals of second groups of group electrical test regions of display units in a same column are electrically connected to one of the plurality of second connection lines; or, second conductive terminals of second groups of group electrical test regions of display units in a same row are electrically connected to one of the plurality of second connection lines, and second conductive terminals of second groups of group electrical test regions of display units in a same column are electrically connected to another one of the plurality of second connection lines.

In some embodiments, each group electrical test region extends in a row direction in which the plurality of array substrates are arranged.

In some embodiments, the at least two array substrates in the display unit include at least one column of array substrates.

In some embodiments, in the plurality of array substrates, one of the plurality of second connection lines is disposed between two adjacent rows of array substrates, and the second connection line is electrically connected to a second conductive terminal of the second group of the group electrical test region of each display unit.

In some embodiments, one of the plurality of second connection lines is disposed between every two adjacent rows of array substrates.

In some embodiments, each group electrical test region extends in a column direction in which the plurality of array substrates are arranged.

In some embodiments, one of the plurality of connection lines includes a plurality of connection sub-lines, and one end of each of the plurality of connection sub-lines is electrically connected to at least one first conductive terminal.

In some embodiments, the plurality of connection lines form a loop.

In some embodiments, each electrical test region is an electrical test pad.

In some embodiments, each group electrical test region is a group electrical test pad.

In some embodiments, the plurality of connection lines are in a same layer and are made of a same material as any conductive layer in the plurality of array substrates.

In some embodiments, the conductive layer includes any one of: a gate electrode layer, a source-drain electrode layer, or an indium tin oxide (ITO) electrode layer.

In another aspect, embodiments of the present disclosure provide a display panel motherboard. The display panel motherboard includes the array substrate motherboard according to any one of the above embodiments is provided.

In some embodiments, the display panel motherboard further includes an opposite substrate motherboard disposed opposite to the array substrate motherboard and a plurality of liquid crystal layers disposed between the array substrate motherboard and the opposite substrate motherboard.

BRIEF DESCRIPTION OF THE DRAWINGS

In order to explain technical solutions in the embodiments of the present disclosure more clearly, the accompanying drawings used in some embodiments of the present disclosure will be introduced briefly. Obviously, the accompanying drawings to be described below are merely some illustrative embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals that the embodiments of the present disclosure relate to.

DETAILED DESCRIPTION

Figure 1A:
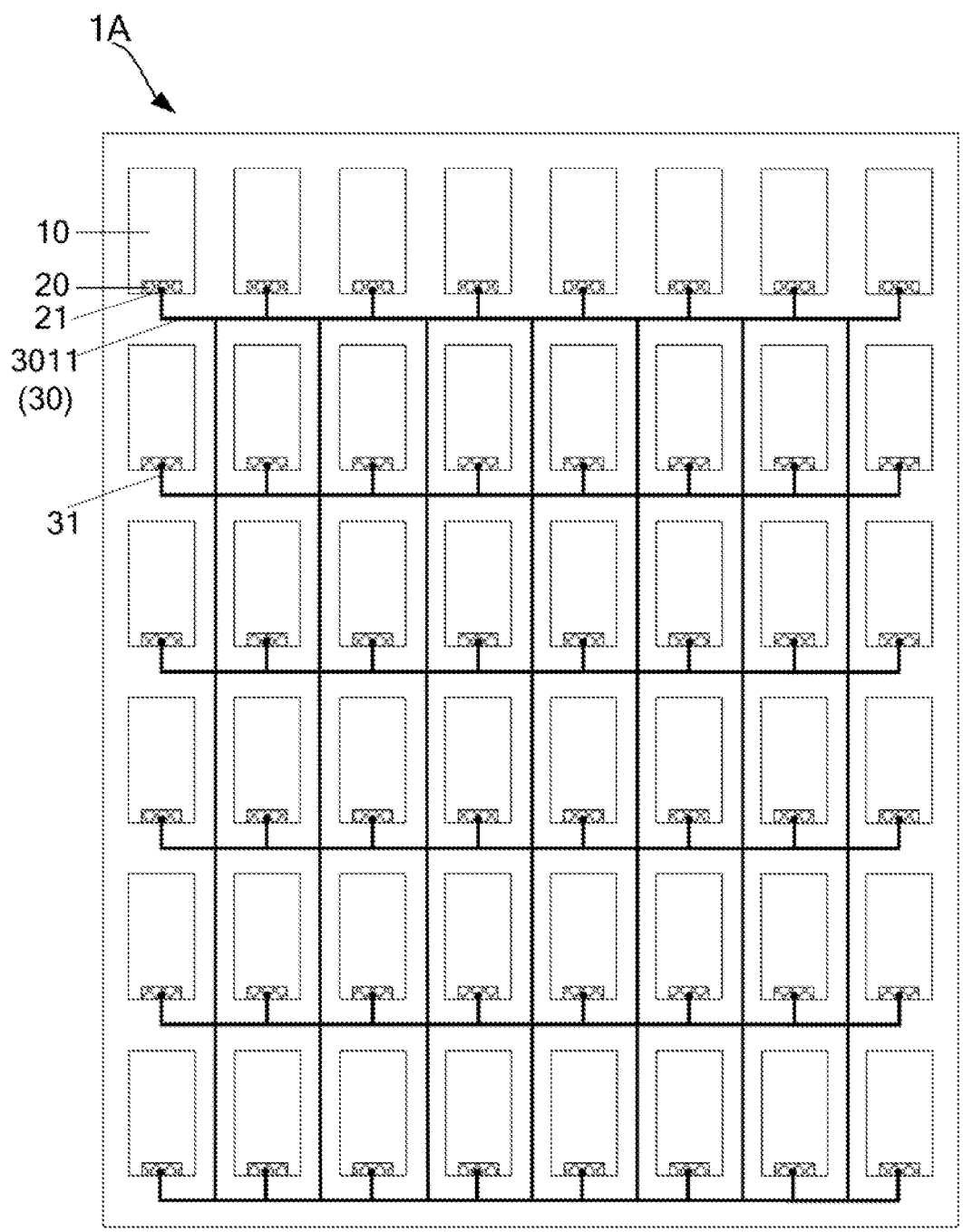
FIG. 1a is a schematic diagram showing a structure of an array substrate motherboard, in accordance with some embodiments of the present disclosure.

Technical solutions in some embodiments of the present disclosure will be described clearly and completely with reference to accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, in the entire description and the claims, the term "comprise/include" and other forms thereof such as the third-person singular form "comprises/includes" and the present participle form "comprising/including" in the description and the claims are construed as open and inclusive, i.e., "inclusive, but not limited to". In the description, the terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

In addition, the terms such as "first" and "second" are used for descriptive purposes only, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

In the description of some embodiments, the terms such as "coupled" and "connected" and their extensions may be used. For example, the terms such as "connected" and "connected in series" may be used in the description of some embodiments to indicate that two or more components are in direct physical or electrical contact with each other. For another example, the term "coupled" may be used in the description of some embodiments to indicate that two or more components are in direct physical or electrical contact. However, the terms such as "coupled" or "communicatively coupled" may also mean that two or more components are not in direct contact with each other but still cooperate or interact with each other. The embodiments disclosed herein are not necessarily limited to the contents herein.

Furthermore, the phrase "at least one of A, B and C" has a same meaning as the phrase "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

Orientations or positional relationships indicated by the terms/phrases such as "up/above", "down/below", "row/row direction" and "column/column direction" are based on the orientations or positional relationships shown in the drawings. They are used merely for convenience of description and simplifying the description of the technical solutions of the present disclosure, but not to indicate or imply that the indicated device or element must have a specific orientation, or be constructed and operated in a specific orientation, and thus cannot be construed as a limitation of the present disclosure.

For example, in certain cases, embodiments involving the "row direction" may be implemented in a case of the "column direction", and vice versa. Technical solutions obtained after the technical solutions of the present disclosure are rotated at 90° or mirrored are also within the scope of the claims requested to be protected by the present disclosure.

Figure 1B:
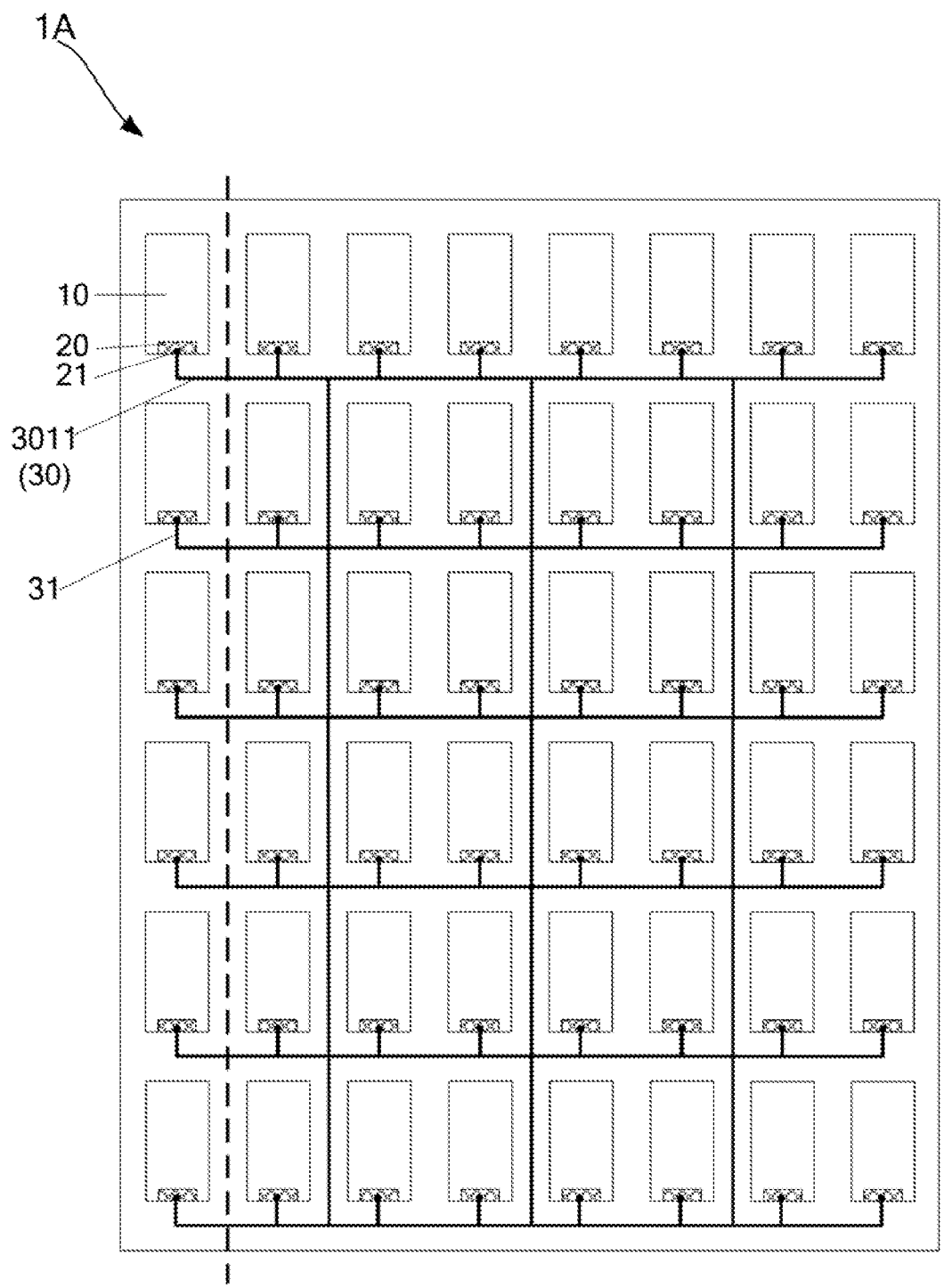
FIG. 1b is a schematic diagram showing a structure of another array substrate motherboard, in accordance with some embodiments of the present disclosure.

Some embodiments of the present disclosure provide an array substrate motherboard 1A. As shown in FIGS. 1a and 1b, the array substrate motherboard 1A includes a plurality of array substrates (i.e., cells) 10. Each array substrate 10 of the plurality of array substrates 10 includes an electrical test region (i.e., an electrical test pad (ET Pad)) 20, and the electrical test region 20 includes a first conductive terminal (i.e., a pin) 21. The first conductive terminal of the electrical test region 20 is shown by a black dot in the accompanying drawings of the embodiments of the present disclosure.

With continued reference to FIGS. 1a and 1b, the array substrate motherboard 1A further includes connection lines 30. The connection lines 30 are electrically connected to the first conductive terminals 21 of the electrical test regions 20 of the plurality of array substrates 10 to electrically connect the plurality of array substrates 10 together.

The array substrate further includes an assembling region, and the electrical test region 20 is located at a side of the assembling region. The assembling region is used to be assembled with an opposite substrate such as a color filter substrate, and the electrical test region 20 further includes an integrated circuit (IC) and a conductive terminal of a wire in the array substrate.

In addition, the number of the array substrates 10 included in the array substrate motherboard 1A is not limited, and may be correspondingly set according to a size of the array substrate motherboard 1A and a size of the array substrate 10.

Here, a manner in which the connection lines 30 are arranged in the array substrate motherboard 1A is not limited, as long as the plurality of array substrates 10 may be electrically connected together. Since the plurality of array substrates 10 are electrically connected together through the connection lines 30, the connection lines 30 may form a loop.

In some embodiments, as shown in FIGS. 1a and 1b, the connection lines 30 are disposed between the plurality of array substrates 10, and the connection lines 30 extend in a row direction or a column direction in which the plurality of array substrates 10 are arranged. For example, as shown in FIGS. 1a and 1b, the plurality of array substrates 10 in the array substrate motherboard 1A may be arranged in a plurality of rows and a plurality of columns. The connection lines 30 are disposed between the plurality of array substrates 10, and the connection lines 30 extend in the row direction or the column direction in which the plurality of array substrates 10 are arranged. That is to say, a connection line 30 is disposed between two adjacent rows or two adjacent columns of array substrates 10, and the connection line 30 extends in the row direction or the column direction in which the plurality of array substrates 10 are arranged. With this design, the first conductive terminals 21 of different array substrates 10 may be electrically connected to a same connection line 30, so that electrostatic charges may be flow among the first conductive terminals 21 of different array substrates 10 through the same connection line 30, so as to facilitate a dispersion of static electricity.

Figure 1C:
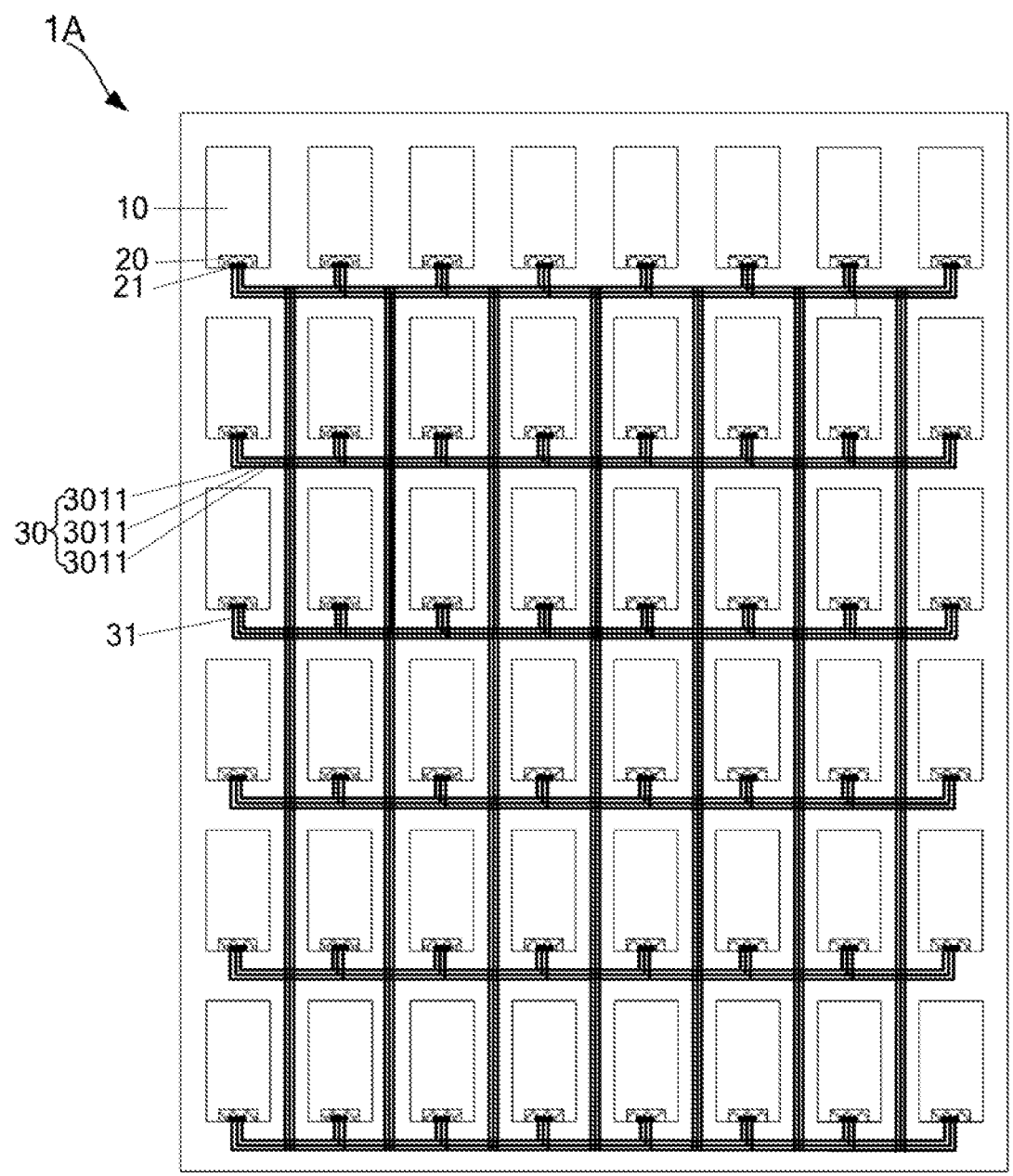
FIG. 1c is a schematic diagram showing a structure of yet another array substrate motherboard, in accordance with some embodiments of the present disclosure.

As for the connection line 30, in some embodiments, as shown in FIGS. 1a and 1b, the connection line 30 is a single one, for example, the connection line 30 includes a single connection sub-line 3011. In some other embodiments, as shown in FIG. 1c, each connection line 30 includes a plurality of connection sub-lines 3011, and one end of each connection sub-line 3011 is electrically connected to at least one first conductive terminal 21. For example, as shown in FIG. 1c, each connection sub-line 3011 has a plurality of connection ends 31, and each connection end 31 of the plurality of connection ends 31 is electrically connected to a first conductive terminal 21. In this way, one end of each connection line 30 may be electrically connected to a plurality of first conductive terminals 21, so that static electricity on the plurality of first conductive terminals 21 may be discharged. In addition, the plurality of connection sub-lines 3011 in each connection line 30 may or may not contact each other, which is not limited.

On this basis, each electrical test region 20 includes a plurality of first conductive terminals 21, and one connection end 31 of a connection sub-line 3011 may be electrically connected to any first conductive terminal 21 in an electrical test region 20, or may be electrically connected to two or more first electrical conductive terminals 21 in an electrical test region 20.

On the above basis, when first conductive terminals electrically connected to the connection line 30 are selected, first conductive terminals 21 having a great risk of failure due to the static electricity or relatively important first conductive terminals 21 may be selected to be electrically connected to the connection line 30.

In some embodiments, the connection lines 30 are in a same layer and are made of a same material as any conductive layer in the plurality of array substrates 10. For example, the any conductive layer may be a patterned conductive layer. For example, the connection lines 30 are in a same layer and are made of a same material as a source-drain electrode layer, that is, the connection lines 30 are in a same layer and are made of a same material as data lines in the array substrates 10. For another example, the connection lines 30 are in a same layer and are made of a same material as a gate electrode layer, that is, the connection lines 30 are in a same layer and are made of a same material as gate lines in the array substrates 10. For yet another example, the connection lines 30 are in a same layer and are made of a same material as electrodes, such as indium tin oxide (ITO) electrodes, in the array substrates 10. In this way, the connection lines 30 may be manufactured at a same time when conductive patterns in the array substrates 10 are formed, thereby simplifying a manufacturing process of the array substrate motherboard 1A.

In some other embodiments, the connection lines 30 may be separately manufactured, and be not manufactured in a same process as any conductive pattern in the array substrates 10. In addition, the connection lines 30 may be formed by using a photoresist coating process, a mask exposure process, a development process and an etching process.

It will be noted that, after a display panel motherboard is manufactured, a lighting operation during an ET needs to be performed on display panels in the display panel motherboard to detect whether circuits and wires of each display panel are normal. Since the display panel motherboard is cut into a plurality of display panels before the electrical test, and the connection lines 30 are severed during the cutting, the lighting operation during the ET that is performed on the display panels is not affected.

The array substrate motherboard 1A provided by the embodiments of the present disclosure includes the plurality of array substrates 10 and the connection lines 30, and the plurality of array substrates 10 in the array substrate motherboard 1A are electrically connected together through the connection lines 30. Therefore, in a case where static electricity is generated at a certain position of the array substrate 10, the static electricity may be conducted out through the connection lines 30. During flow of the static electricity, the static electricity accumulated at the position is discharged, and is dispersed by different positions. Therefore, the amount of the static electricity at the position is reduced, a problem of a large amount of the accumulated static electricity is improved, the product is prevented from being damaged due to the discharge of the static electricity, and a product yield is improved.

In a process of performing the lighting operation during the ET on the plurality of display panels in the display panel motherboard, the display panel motherboard may be cut into separate display panels, and the lighting operation during the ET is performed on each display panel, that is, the display panels are detected by using an electrical test in cells (i.e., a Cell ET manner). The display panel motherboard may also be cut into a plurality of groups of display panels, and the lighting operation during the ET is performed on each group of display panels, that is, the display panels are detected by using an electrical test in groups (i.e., a Group ET manner). Of course, the display panel motherboard may also be cut into a plurality of lines of display panels, and the lighting operation during the ET is performed on display panels in each line, that is, the display panels are detected by using an electrical test in sticks (i.e., a Stick ET manner).

On this basis, in a process of designing the connection lines 30, an arrangement of the connection lines 30 may be designed according to a manner in which the display panel motherboard is cut and a lighting operation manner during the ET.

In a first manner, in some embodiments, as shown in FIGS. 1a and 1b, array substrates 10 in each row in the plurality of array substrates 10 are electrically connected together through a connection line 30.

In this case, array substrates 10 in adjacent rows may be electrically connected together through one connection line 30, or may be electrically connected together through a plurality of connection lines 30 as shown in FIGS. 1a and 1b.

It will be noted that, in a case where the array substrates 10 in each row are electrically connected together through a connection line 30, after the display panel motherboard is manufactured, the display panel motherboard may be first cut into a plurality of lines of display panels in a row direction, and then each line of display panels is cut into separate display panels. That is, a Stick Cut is first performed, and then a Cell Cut is performed. In this case, the lighting operation during the ET may be performed on each display panel, that is, each display panel is detected by using the Cell ET manner.

In some other embodiments, as shown in FIG. 1a, array substrates 10 in each column in the plurality of array substrates 10 are electrically connected together through a connection line 30.

In this case, array substrates 10 in adjacent columns may be electrically connected together through one connection line 30, or may be electrically connected together through a plurality of connection lines 30.

It will be noted that, in a case where the array substrates 10 in each column are electrically connected together through a connection line 30, after the display panel motherboard is manufactured, the display panel motherboard may be cut into a plurality of lines of display panels in a column direction, and then each line of display panels is cut into separate display panels. That is, the Stick Cut is first performed, and then the Cell Cut is performed. In this case, the lighting operation during the ET may be performed on each display panel, that is, each display panel is detected by using the Cell ET manner.

Considering that, as shown in FIG. 1b, if the array substrates 10 in each row are electrically connected together through a connection line 30, and array substrates in one of every two columns are electrically connected together through a connection line 30, and if a cutting is performed along a middle position between the two columns of array substrates (indicated by the dotted line in FIG. 1b), there will be array substrates in the other of the two columns that are not connected together through the connection line 30. Therefore, static electricity generated by any array substrate 10 in the array substrates in this column cannot be discharged through the connection line 30. Similarly, if the array substrates 10 in each column are electrically connected together through a connection line 30, and array substrates in one of every two or more rows are electrically connected together through a connection line 30, there will be a same problem as above during a cutting.

On the above basis, in the embodiments of the present disclosure, as shown in FIG. 1a, the array substrates 10 in each row are electrically connected together through a connection line 30, and the array substrates 10 in each column are electrically connected together through a connection line 30. In this way, regardless of whether the display panel motherboard is cut along any row of array substrates or any column of array substrates, static electricity generated by any array substrate 10 on the array substrate motherboard 1A may be discharged.

In a second manner, as shown in FIGS. 2a, 2b, 2c, 3a and 3b, the connection lines 30 include first connection lines 301 and second connection lines 302. The array substrate motherboard 1A is divided into a plurality of display units 01, each display unit 01 of the plurality of display units 01 includes at least two array substrates 10, and each display unit 01 further includes a group electrical test region 40 (i.e., a group electrical test pad, (Group ET Pad)). The group electrical test region 40 includes second conductive terminals 41, and the second conductive terminals 41 are divided into a first group and a second group with different functions. In each display unit 01, the first conductive terminal 21 of the electrical test region 20 of each array substrate 10 is electrically connected to a second conductive terminal 41 of the first group of the group electrical test region 40 of the display unit 01 through first connection line(s) 301. In the plurality of display units 01, second conductive terminals 41 of second groups of the group electrical test regions 40 of the display units 01 are electrically connected together through the second connection lines 302.

The number of the array substrates 10 included in each display unit 01 is not limited. Each display unit 01 may include two array substrates 10, or may include more than two array substrates 10.

Figure 2A:
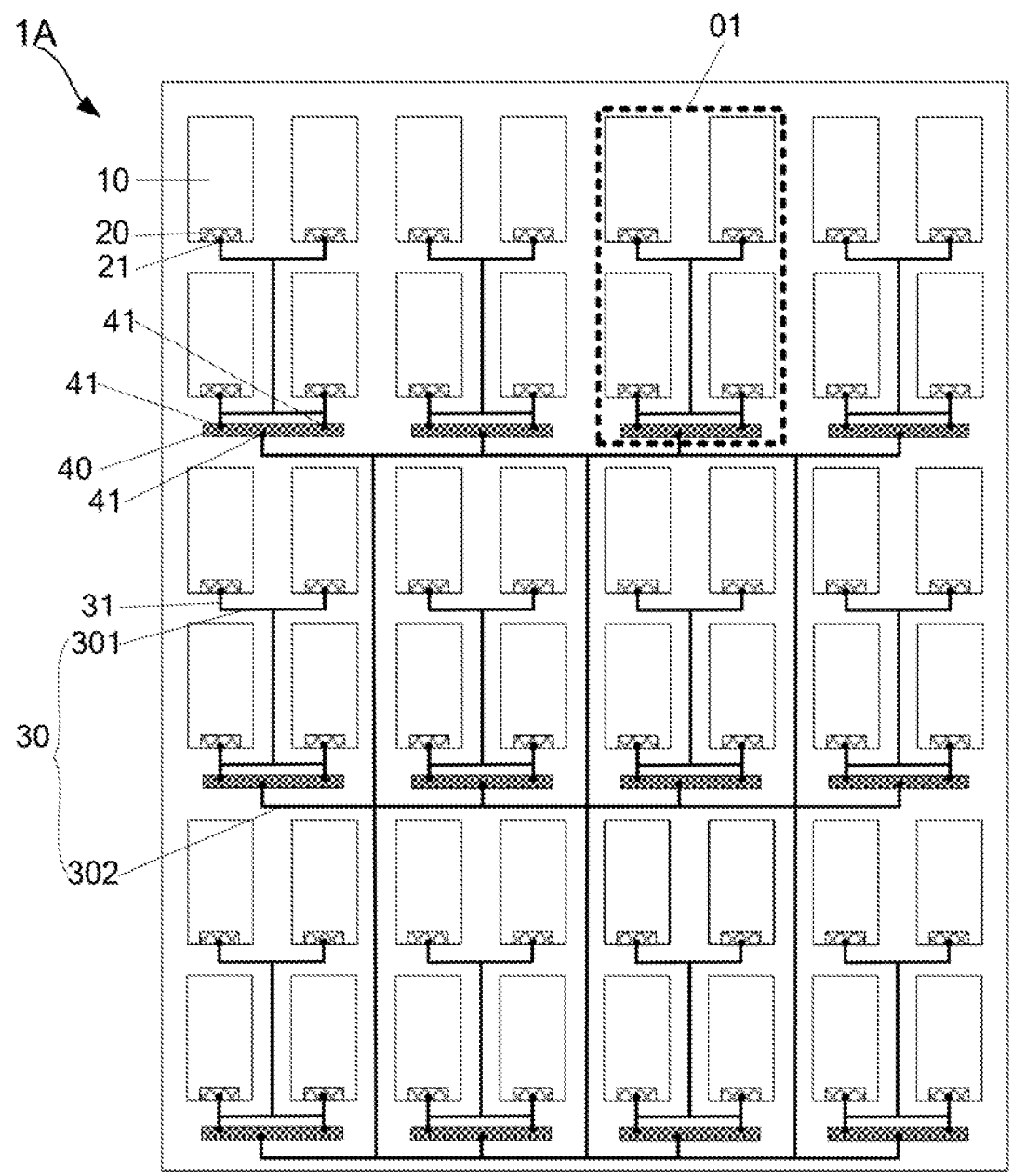
FIG. 2a is a schematic diagram showing a structure of yet another array substrate motherboard, in accordance with some embodiments of the present disclosure.
Figure 2B:
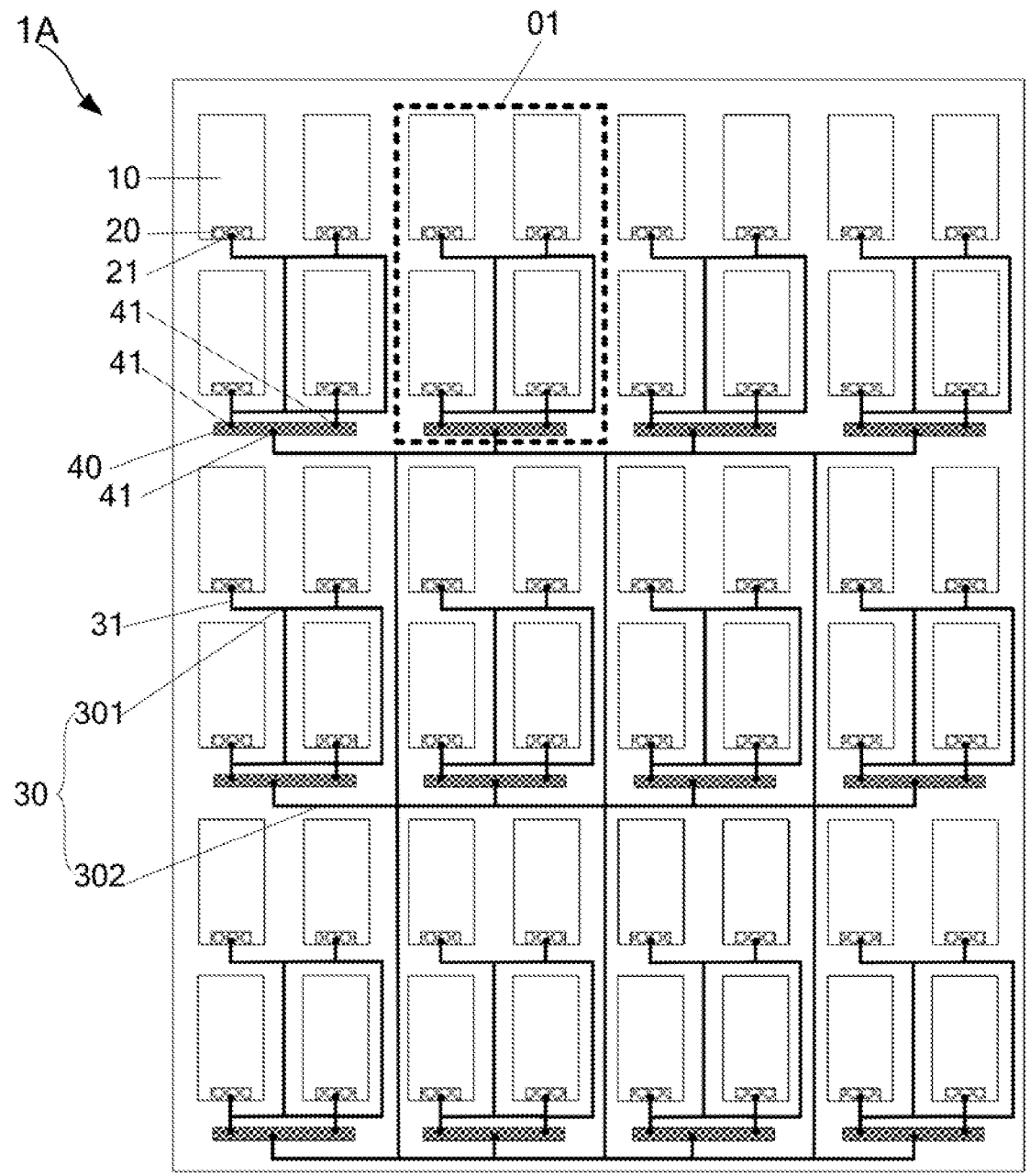
FIG. 2b is a schematic diagram showing a structure of yet another array substrate motherboard, in accordance with some embodiments of the present disclosure.

Here, the first conductive terminal 21 of the electrical test region 20 of each array substrate 10 may be electrically connected to a second conductive terminal 41 of the first group of the group electrical test region 40 through one first connection line 301 or a plurality of first connection lines 301. With reference to FIGS. 2*a* and 2*b*, as for a display unit 01, the number of the first connection lines 301 in FIG. 2*b* is greater than the number of the first connection lines 301 in FIG. 2*a*. The first conductive terminal 21 of the electrical test region 20 of each array substrate 10 in a display unit 01 in FIG. 2*b* is electrically connected to a second conductive terminal 41 of the first group of the group electrical test region 40 through a plurality of first connection lines 301. Therefore, in a case where a certain first connection line 301 is damaged, a signal may be transmitted through other first connection line(s) 301, thereby improving a reliability of the electrical connection between the first conductive terminal 21 of the electrical test region 20 of each array substrate 10 and the second conductive terminal 41 of the first group of the group electrical test region 40.

It will be noted that, a purpose of providing the group electrical test region 40 is to determine whether there are abnormal displays (ADs) of a plurality of array substrates 10 in each display unit 01 by performing the lighting operation during the ET on the group electrical test region 40. In a process of detecting each display unit 01, the plurality of array substrates 10 may be simultaneously detected. Therefore, a detection efficiency may be improved relative to separate detections of the plurality of array substrates 10.

An arrangement of the plurality of array substrates 10 in each display unit 01 is not limited, and two specific implementations are provided below.

Figure 2C:
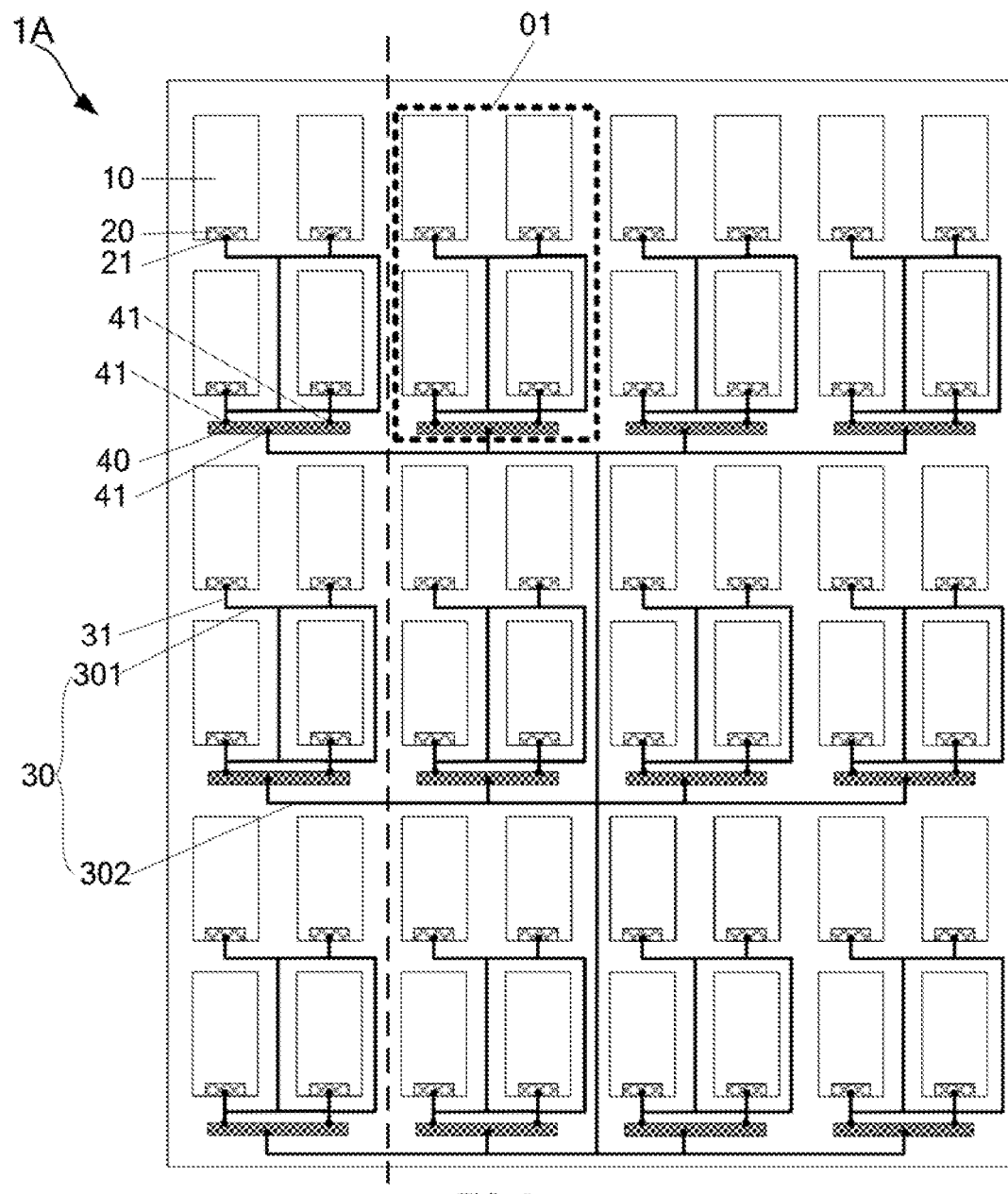
FIG. 2c is a schematic diagram showing a structure of yet another array substrate motherboard, in accordance with some embodiments of the present disclosure.

In some embodiments of the present disclosure, as shown in FIGS. 2*a*, 2*b* and 2*c*, each display unit 01 includes m rows and n columns of array substrates 10. m and n are positive integers, m is less than the number of rows in which all array substrates 10 in the array substrate motherboard are arranged, and n is less than the number of columns in which all array substrates 10 in the array substrate motherboard are arranged. That is to say, each display unit 01 includes some of the plurality of array substrates 10 that are arranged in m rows and n columns. For example, as shown in FIGS. 2*a*, 2*b* and 2*c*, each display unit 01 includes four array substrates 10 arranged in two rows and two columns.

In some embodiments, an arrangement of the array substrates 10 in each display unit 01 is the same. In some other embodiments, the arrangement of the array substrates 10 in each display unit 01 is not completely the same. In order to facilitate to cut and design the second connection lines 302, and in order that the second connection lines 302 are electrically connected to second conductive terminals 41 of the second groups of a plurality of group electrical test regions 40, the arrangement of the array substrates 10 in each display unit 01 is the same in some embodiments of the present disclosure.

Here, m and n are not limited. For example, both m and n are equal to 2. Or, m is equal to 3, and n is equal to 2.

In some embodiments, each display unit 01 includes a plurality of rows and a plurality of columns of array substrates 10. As shown in FIG. 2*b*, in each display unit 01, first conductive terminals 21 of electrical test regions 20 of array substrates 10 in a same row are electrically connected to a first connection line 301, and first conductive terminals 21 of electrical test regions 20 of array substrates 10 in a same column are electrically connected to a first connection line 301. In this way, as shown in FIG. 2*b*, first conductive terminals 21 of electrical test regions 20 included in array substrates 10 in each line (which may be a row or a column) in each display unit 01 are electrically connected to a second conductive terminal 41 of the first group of the group electrical test region 40 through a first connection line 301. Therefore, in the case where a certain first connection line 301 is damaged, the signal may be transmitted through other first connection line(s) 301, thereby improving the reliability of the electrical connection between the first conductive terminal 21 of the electrical test region 20 of each array substrate 10 and the second conductive terminal 41 of the first group of the group electrical test region 40.

In a case where each display unit 01 includes m rows and n columns of array substrates 10, a manner in which the second connection lines 302 are arranged is not limited, as long as the second connection lines 302 may be electrically connected to second conductive terminals of the second groups of the group electrical test regions 40.

In some embodiments, as shown in FIGS. 2*a*, 2*b* and 2*c*, second conductive terminals 41 of the second groups of group electrical test regions 40 in display units 01 in a same row are electrically connected to a second connection line 302. In this case, as shown in FIG. 2*c*, second conductive terminals 41 of the second groups of group electrical test regions 40 in display units 01 in adjacent rows are electrically connected together through one second connection line 302. Or, as shown in FIGS. 2*a* and 2*b*, second conductive terminals 41 of the second groups of group electrical test regions 40 in display units 01 in adjacent rows are electrically connected together through two or more second connection lines 302.

In some other embodiments, as shown in FIGS. 2*a*, 2*b* and 2*c*, second conductive terminals 41 of the second groups of group electrical test regions 40 in display units 01 in a same column are electrically connected to a second connection line 302. In this case, second conductive terminals 41 of the second groups of group electrical test regions 40 in display units 01 in adjacent columns may be electrically connected together through one second connection line 302, or may be electrically connected together through two or more second connection lines 302.

As shown in FIG. 2*c*, if the second conductive terminals 41 of the second groups of the group electrical test regions 40 in the display units 01 in the same row are electrically connected to a second connection line 302, and the second conductive terminals 41 of the second groups of the group electrical test regions 40 in the display units 01 in the adjacent rows are electrically connected together through a second connection line 302, and if a cutting is performed along a middle position between the adjacent columns of display units 01 (shown by the dotted line in FIG. 2*c*), group electrical test regions 40 of display units 01 in each of some columns will not be connected together through the connection line 30. Therefore, static electricity generated by any display unit 01 of the display units 01 in this column cannot be discharged through the second connection line 302. Similarly, if the second conductive terminals 41 of the second groups of the group electrical test regions 40 in the display units 01 in the same column are electrically connected to a second connection line 302, and the second conductive terminals 41 of the second groups of the group electrical test regions 40 in the display units 01 in the adjacent columns are electrically connected together through a second connection line 302, there will be a same problem as above during a cutting.

On this basis, in some embodiments of the present disclosure, the second conductive terminals 41 of the second groups of the group electrical test regions 40 in the display units 01 in the same row are electrically connected to a second connection line 302, and the second conductive terminals 41 of the second groups of the group electrical test regions 40 in the display units 01 in the same column are electrically connected to a second connection line 302.

It will be noted that, after the display panel motherboard is manufactured, the display panel motherboard may be first cut into a plurality of display units 01, and then each display unit 01 may be cut into separate display panels. That is, the Group Cut is first performed, and then the Cell Cut is performed. Since each display unit 01 has a group electrical test region 40, the lighting operation during the ET may be performed on the group electrical test region 40 to determine whether there are ADs of the plurality of array substrates 10 in the display unit 01. That is, each display panel is detected by using the Group ET manner.

A person skilled in the art should understand that, before the lighting operation during the ET is performed on the group electrical test region 40 in the display unit 01, the display panel motherboard is first cut into a plurality of display units 01. In this case, the second connection lines 302 electrically connected to second conductive terminals 41 of the second groups of the group electrical test regions 40 are severed during the cutting. Therefore, the lighting operation during the ET that is performed on each display unit 01 is not affected.

Figure 3A:
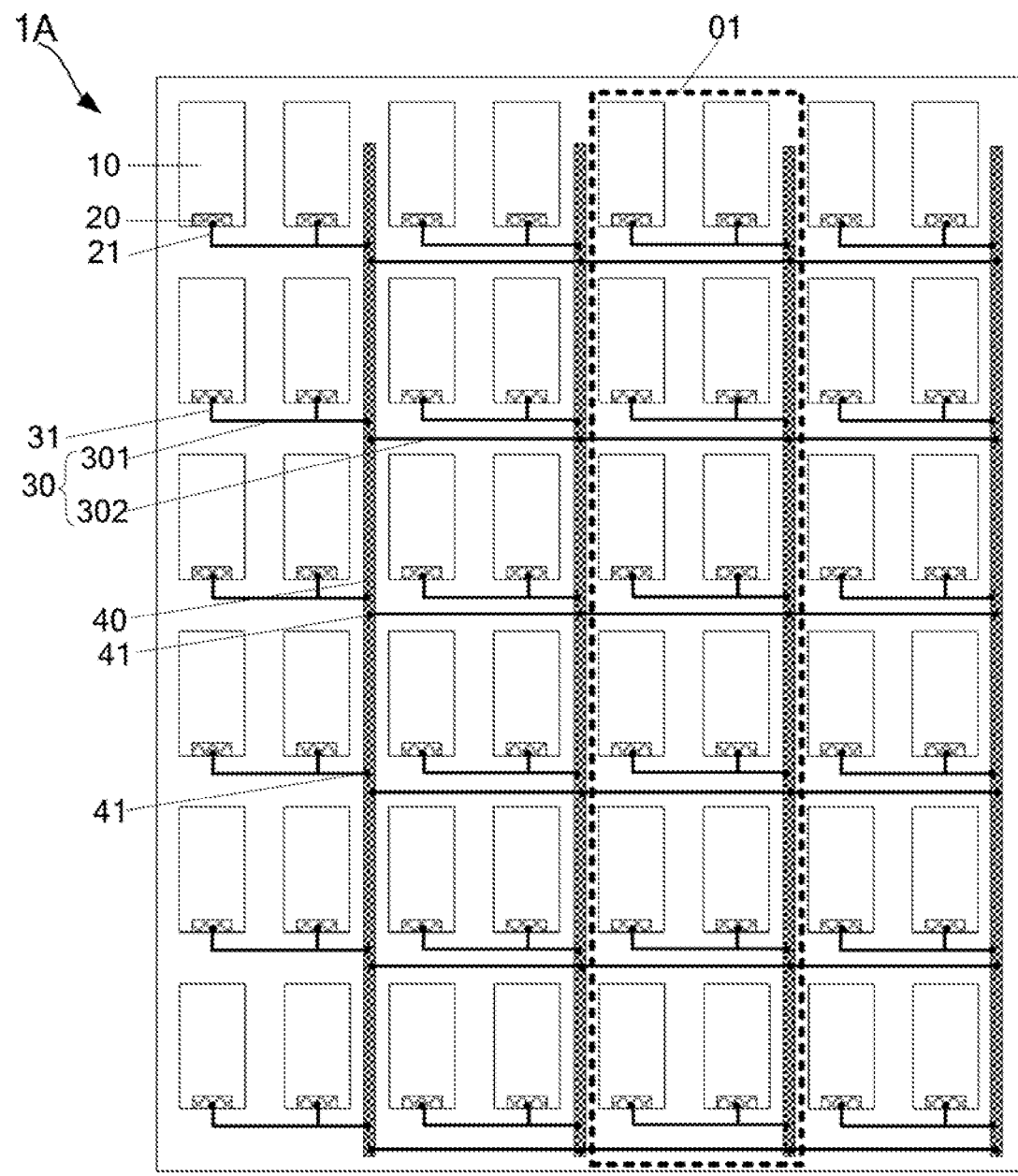
FIG. 3a is a schematic diagram showing a structure of yet another array substrate motherboard, in accordance with some embodiments of the present disclosure.
Figure 3B:
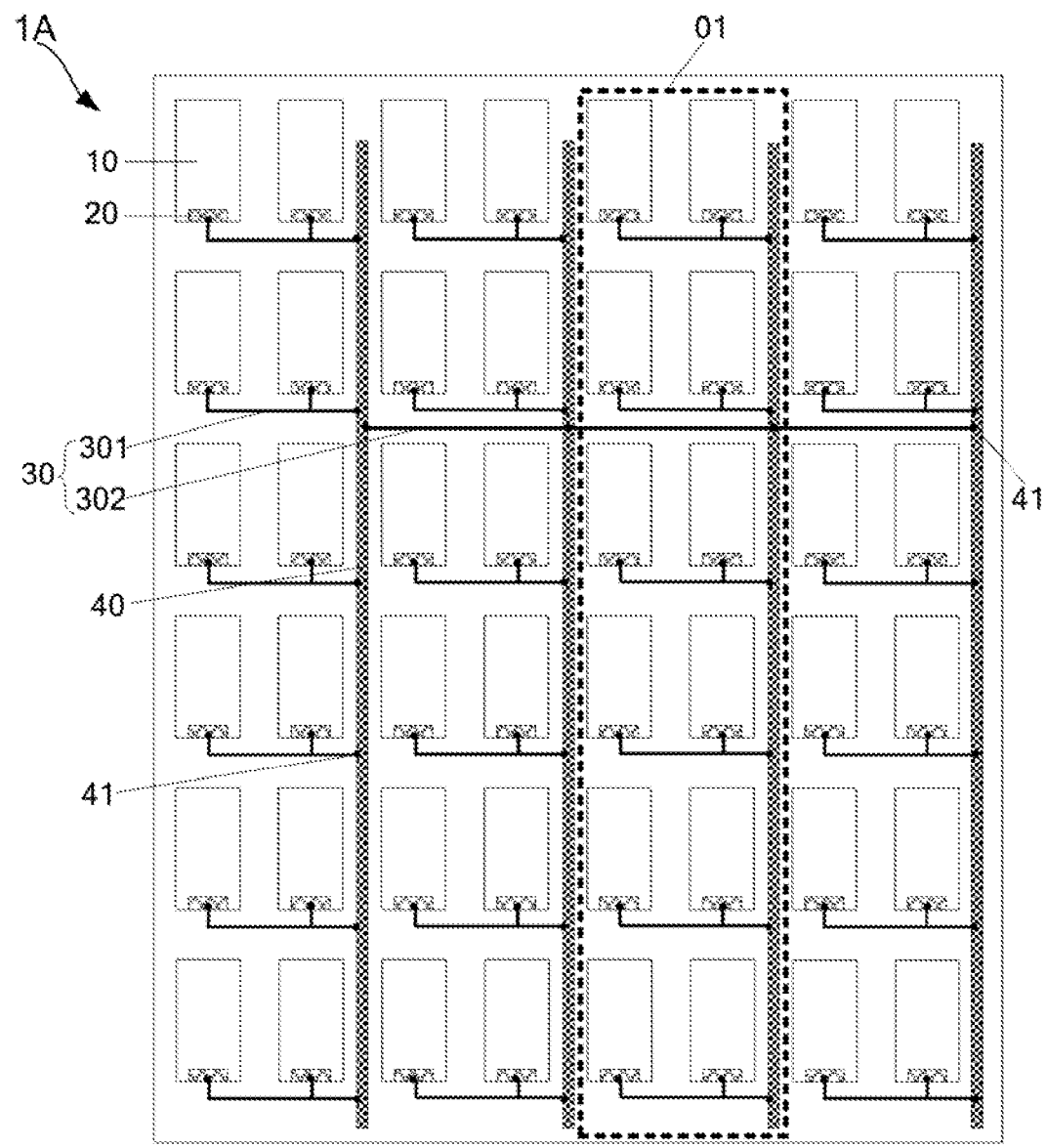
FIG. 3b is a schematic diagram showing a structure of yet another array substrate motherboard, in accordance with some embodiments of the present disclosure.

In some embodiments of the present disclosure, as shown in FIGS. 3a and 3b, each display unit 01 includes at least one column of array substrates 10 in the array substrate motherboard 1A.

Here, each display unit 01 may include one column of array substrates 10, or may include two or more columns of array substrates 10 in the array substrate motherboard 1A.

In a case where each display unit 01 includes at least one column of array substrates 10 in the array substrate motherboard 1A, second conductive terminals 41 of the second groups of group electrical test regions 40 in adjacent display units 01 may be connected together through a second connection line 302 as shown in FIG. 3b, or may be connected together through a plurality of second connection lines 302 as shown in FIG. 3a.

If the number of the second connection lines 302 is small, the static electricity may not be quickly discharged. On this basis, in some embodiments of the present disclosure, in the plurality of array substrates 10, a second connection line 302 is disposed between two adjacent rows of array substrates 10, and the second connection line 302 is electrically connected to a second conductive terminal 41 of the second group of the group electrical test region 40 of each display unit 01.

For example, as shown in FIG. 3a, a second connection line 302 is disposed between every two adjacent rows of array substrates 10. This arrangement makes it possible to quickly discharge the static electricity.

For example, as shown in FIG. 3b, a second connection line 302 is disposed between two adjacent rows of array substrates 10 in any group.

It will be noted that, in the case where each display unit 01 includes at least one column of array substrates 10 in the array substrate motherboard 1A, after the display panel motherboard is manufactured, the display panel motherboard may be first cut into a plurality of display units 01, and then each display unit 01 is cut into separate display panels. That is, the Stick Cut is first performed, and then the Cell Cut is performed. Since each display unit 01 has a group electrical test region 40, the lighting operation during the ET may be performed on the group electrical test region 40 to determine whether there are ADs of the plurality of array substrates 10 in the display unit 01. That is, each display panel is detected by using the Stick ET manner.

It will be noted that, before the lighting operation during the ET is performed on the group electrical test region 40 in the display unit 01, the display panel motherboard is first cut into a plurality of display units 01. In this case, the second connection lines 302 electrically connected to the second conductive terminals 41 of the second groups of the group electrical test regions 40 are severed during the cutting. Therefore, the lighting operation during the ET that is performed on each display unit 01 is not affected.

The manner in which the connection lines 30 are arranged in the embodiments of the present disclosure includes but is not limited to the first manner and the second manner described above.

Figure 4:
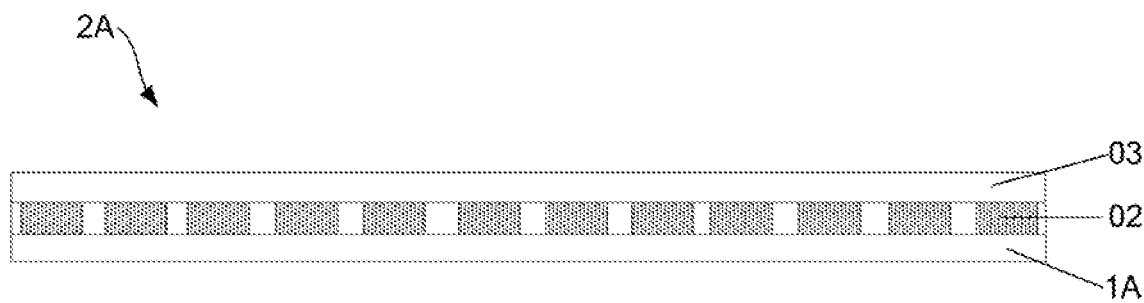
FIG. 4 is a schematic diagram showing a structure of a display panel motherboard, in accordance with some embodiments of the present disclosure.

As shown in FIG. 4, some embodiments of the present disclosure provide a display panel motherboard 2A including the above array substrate motherboard 1A.

Here, a type of the display panel motherboard 2A is not limited. In some embodiments, the display panel motherboard 2A is a liquid crystal display (LCD) panel motherboard. In some other embodiments, the display panel motherboard is a self-luminescent display panel motherboard, such as an organic light-emitting display (OLED) panel motherboard or a quantum dot light-emitting display (QLED) panel motherboard.

In a case where the display panel motherboard 2A is the LCD panel motherboard, the display panel motherboard 2A includes the array substrate motherboard 1A, an opposite substrate motherboard (e.g., a color filter substrate motherboard) 03, and liquid crystal layers 02 disposed between the array substrate motherboard 1A and the opposite substrate motherboard 03. In a case where the display panel motherboard 2A is the self-luminescent display panel motherboard, the display panel motherboard 2A includes the array substrate motherboard 1A and an encapsulation layer for encapsulating the array substrate motherboard 1A.

The array substrate motherboard 1A in the display panel motherboard 2A provided by the embodiments of the present disclosure includes the plurality of array substrates 10 and the connection lines 30, and the plurality of array substrates 10 in the array substrate motherboard 1A are electrically connected together through the connection lines 30. Therefore, in the case where the static electricity is generated at a certain position, the static electricity may be conducted out through the connection lines 30. During the flow of the static electricity, the static electricity accumulated at the position is discharged, and may be dispersed by different positions. Therefore, the amount of the static electricity at the position is reduced, the problem of a large amount of the accumulated static electricity is improved, the product is prevented from being damaged due to the discharge of the static electricity, and the product yield is improved.

On this basis, in the case where the display panel motherboard 2A is the self-luminescent display panel motherboard, an excessive amount of the accumulated static electricity may cause a failure of a reliability of an encapsulation such as a frit encapsulation. In the embodiments of the present disclosure, the amount of the static electricity accumulated on the display panel motherboard 2A may be reduced, and thus a risk of the failure of the reliability of the encapsulation may be further reduced.

The forgoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. An array substrate motherboard, comprising:
   a plurality of array substrates, wherein each of the plurality of array substrates includes an electrical test region, and the electrical test region includes a first conductive terminal; and
   a plurality of connection lines,
   wherein the plurality of connection lines are electrically connected to first conductive terminals of electrical test regions of the plurality of array substrates to electrically connect all of the plurality of array substrates together,
   wherein the plurality of connection lines include a plurality of first connection lines and a plurality of second connection lines,
   wherein the array substrate motherboard has a plurality of display units, and each display unit of the plurality of display units includes at least two of the plurality of array substrates, the each display unit further includes a group electrical test region, the group electrical test region includes a plurality of second conductive terminals, and the plurality of second conductive terminals include a first group and a second group,
   wherein, in each display unit, the first conductive terminal of the electrical test region of each array substrate is electrically connected to a second conductive terminal of the first group of the group electrical test region of the each display unit through at least one of the plurality of first connection lines, and
   wherein second conductive terminals of second groups of group electrical test regions of the plurality of display units are electrically connected together through the plurality of second connection lines.

2. The array substrate motherboard according to claim 1, wherein the plurality of connection lines are disposed between the plurality of array substrates, and the plurality of connection lines extend in a row direction or a column direction in which the plurality of array substrates are arranged.

3. The array substrate motherboard according to claim 1, wherein
   array substrates in each row in the plurality of array substrates are electrically connected together through one of the plurality of connection lines;
   or, array substrates in each column in the plurality of array substrates are electrically connected together through one of the plurality of connection lines;
   or, array substrates in each row in the plurality of array substrates are electrically connected together through one of the plurality of connection lines, and array substrates in each column in the plurality of array substrates are electrically connected together through another one of the plurality of connection lines.

4. The array substrate motherboard according to claim 1, wherein the at least two of the plurality of array substrates in the each display unit includes m rows and n columns of array substrates,
   wherein m and n are positive integers, and
   wherein m is less than a number of rows in which the plurality of array substrates in the array substrate motherboard are arranged, and n is less than a number of columns in which the plurality of array substrates in the array substrate motherboard are arranged.

5. The array substrate motherboard according to claim 4, wherein m and n are both greater than 1, and
   wherein, in each display unit, first conductive terminals of electrical test regions of array substrates in a same row are electrically connected to one of the plurality of first connection lines, and
   wherein, in each display unit, first conductive terminals of electrical test regions of array substrates in a same column are electrically connected to another one of the plurality of first connection lines.

6. The array substrate motherboard according to claim 4, wherein
   second conductive terminals of second groups of group electrical test regions of display units in a same row are electrically connected to one of the plurality of second connection lines
   or, second conductive terminals of second groups of group electrical test regions of display units in a same column are electrically connected to one of the plurality of second connection lines;
   or, second conductive terminals of second groups of group electrical test regions of display units in a same row are electrically connected to one of the plurality of second connection lines, and second conductive terminals of second groups of group electrical test regions of display units in a same column are electrically connected to another one of the plurality of second connection lines.

7. The array substrate motherboard according to claim 1, wherein the at least two of the plurality of array substrates in the each display unit include at least one column of array substrates.

8. The array substrate motherboard according to claim 7, wherein in the plurality of array substrates, one of the plurality of second connection lines is disposed between two adjacent rows of array substrates, and the one of the plurality of second connection lines is electrically connected to a second conductive terminal of the second group of the group electrical test region of each display unit.

9. The array substrate motherboard according to claim 8, wherein one of the plurality of second connection lines is disposed between every two adjacent rows of array substrates.

10. The array substrate motherboard according to claim 1, wherein one of the plurality of connection lines includes a plurality of connection sub-lines, and one end of each of the plurality of connection sub-lines is electrically connected to at least one first conductive terminal.

11. The array substrate motherboard according to claim 1, wherein the plurality of connection lines are in a same layer and are made of a same material as a conductive layer in the plurality of array substrates.

12. The array substrate motherboard according to claim 11, wherein the conductive layer includes any one of a gate electrode layer, a source-drain electrode layer, or an indium tin oxide (ITO) electrode layer.

13. A display panel motherboard, comprising the array substrate motherboard according to claim 1.

14. The display panel motherboard according to claim 13, further comprising:
- an opposite substrate motherboard disposed opposite to the array substrate motherboard; and
- a plurality of liquid crystal layers disposed between the array substrate motherboard and the opposite substrate motherboard.

15. The array substrate motherboard according to claim 4, wherein each group electrical test region extends in a row direction in which the plurality of array substrates are arranged.

16. The array substrate motherboard according to claim 7, wherein each group electrical test region extends in a column direction in which the plurality of array substrates are arranged.

17. The array substrate motherboard according to claim 1, wherein the plurality of connection lines form a loop.

18. The array substrate motherboard according to claim 1, wherein each electrical test region is an electrical test pad.

19. The array substrate motherboard according to claim 1, wherein each group electrical test region is a group electrical test pad.

* * * * *

UNITED STATES PATENT AND TRADEMARK OFFICE
CERTIFICATE OF CORRECTION

| | |
|---|---|
| PATENT NO. | : 11,360,361 B2 |
| APPLICATION NO. | : 16/957343 |
| DATED | : June 14, 2022 |
| INVENTOR(S) | : Dan Jia |

It is certified that error appears in the above-identified patent and that said Letters Patent is hereby corrected as shown below:

On the Title Page

Item (54), the Title is corrected to read as:
(54) ARRAY SUBSTRATE MOTHERBOARD AND DISPLAY PANEL MOTHERBOARD In the Specification On Column 1, Lines 1-2, the Title is corrected to read as:
ARRAY SUBSTRATE MOTHERBOARD AND DISPLAY PANEL MOTHERBOARD Signed and Sealed this
Sixteenth Day of May, 2023

Katherine Kelly Vidal
*Director of the United States Patent and Trademark Office*